US012568736B2

(12) United States Patent
Jiang et al.

(10) Patent No.: US 12,568,736 B2
(45) Date of Patent: Mar. 3, 2026

(54) PIXEL STRUCTURE AND DISPLAY PANEL

(71) Applicant: HKC CORPORATION LIMITED, Shenzhen (CN)

(72) Inventors: Lei Jiang, Shenzhen (CN); Rongrong LI, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 416 days.

(21) Appl. No.: 18/363,150

(22) Filed: Aug. 1, 2023

(65) Prior Publication Data
US 2024/0324295 A1      Sep. 26, 2024

(30) Foreign Application Priority Data
Mar. 21, 2023      (CN) .......................... 202310275143.2

(51) Int. Cl.
*H10K 59/122*      (2023.01)
(52) U.S. Cl.
CPC ................................. *H10K 59/122* (2023.02)
(58) Field of Classification Search
CPC .... H10K 59/122; H10K 59/00; H10K 59/131; H10K 59/80521
See application file for complete search history.

(56) References Cited

U.S. PATENT DOCUMENTS

2018/0212007 A1      7/2018   Lee et al.
2022/0352480 A1      11/2022  Hopkin

FOREIGN PATENT DOCUMENTS

| | | |
|---|---|---|
| CN | 204257656 U | 4/2015 |
| CN | 104885251 A | 9/2015 |
| CN | 106206646 A | 12/2016 |
| CN | 107565048 A | 1/2018 |
| CN | 107731883 A | 2/2018 |
| CN | 109360900 A | 2/2019 |
| CN | 109449314 A | 3/2019 |
| CN | 110224005 A | 9/2019 |
| CN | 113437233 A | 9/2021 |
| CN | 113851509 A | 12/2021 |
| CN | 114361226 A | 4/2022 |
| CN | 114709244 A | 7/2022 |
| CN | 115440771 A | 12/2022 |
| CN | 115988905 A | 4/2023 |

OTHER PUBLICATIONS

Search Report on Patentability issued on Nov. 29, 2023, in corresponding International Application No. PCT/CN2023/097150, 8 pages.

*Primary Examiner* — Elmito Breval
(74) *Attorney, Agent, or Firm* — Maier & Maier, PLLC

(57) ABSTRACT

A pixel structure includes: a plurality of sub-pixels, for each sub-pixel, the sub-pixel includes cathode bonding units; each cathode bonding unit includes an isolation column, a conduction unit, and a roof structure arranged from bottom to top The isolation column is located above an anode of the sub-pixel, a luminescent layer of the sub-pixel covers the anode and the isolation column, and a cathode of the sub-pixel covers the luminescent layer and is bonded to the conduction unit. A pixel boundary layer is arranged between adjacent sub-pixels. The pixel boundary layer includes a pixel definition layer, a boundary conducting layer, and a roof structure arranged from bottom to top. The conduction unit is connected to the boundary conducting layer. The pixel structure can enhance a bonding effect between a cathode of each sub-pixel and a boundary conducting layer, and improve the yield of the product.

18 Claims, 5 Drawing Sheets

PIXEL STRUCTURE AND DISPLAY PANEL

CROSS-REFERENCE TO RELATED APPLICATION

Pursuant to 35 U.S.C. § 119 and the Paris Conversion, this application claims priority to Chinese Patent Application No. 202310275143.2 filed Mar. 21, 2023, the entire contents of which are incorporated herein by reference.

FIELD

The present application relates to the technical field of displaying technologies, and more particularly to a pixel structure and a display panel.

BACKGROUND

The statements provided herein are merely background information related to the present application, and do not necessarily constitute any prior arts. Luminescent devices such as organic light emitting diodes (OLEDs) are more and more widely used in products such as televisions and mobile phones, due to their characteristics including light and thin, energy conservation, wide color gamut, and high contrast.

In a preparation process of the OLEDs, more and more manufacturers are starting to use evaporation plating technology to perform whole surface film formation processing on a substrate, and then use photolithography technology to etch the substrate after the whole surface film formation processing to form various pixels.

However, when evaporation and photolithography technologies are used to prepare diamond or polygonal pixels having excellent display effects, a poor bonding effect between a cathode and a boundary conducting layer of the pixel may be caused, and even a phenomenon of inability to bond the cathode to the boundary conducting layer occurs, the yield of the product is influenced.

SUMMARY

In view of this, the present application provides a pixel structure and a display panel which are used to enhance a bonding effect between a cathode of each sub-pixel and a boundary conducting layer to improve the yield of the display panel.

In order to achieve the aforesaid objective, according to the first aspect of the embodiments of the present application, a pixel structure is provided. The pixel structure includes a plurality of sub-pixels, each sub-pixel includes a plurality of cathode bonding units.

Each cathode bonding unit includes an isolation column, a conduction unit, and a first roof structure arranged from bottom to top, an extension direction of a metal wire formed by the conduction unit is perpendicular to a first direction, and the first direction is an evaporation direction of a display panel;

The isolation column is located at a top of an anode of the sub-pixel, a luminescent layer of the sub-pixel covers the anode and the isolation column, and a cathode of the sub-pixel covers the luminescent layer and is bonded to the conduction unit.

One pixel boundary layer is arranged between two adjacent sub-pixels; wherein the pixel boundary layer includes a pixel definition layer, a boundary conducting layer and a second roof structure arranged from bottom to top, and the conduction unit is connected to the boundary conducting layer.

In some embodiments, one end of the metal wire formed by the conduction unit protrudes a target length from an edge of the sub-pixel in a direction perpendicular to the first direction.

In some embodiments, one end of the metal wire formed by the conduction unit is connected to the boundary conducting layer.

In some embodiments, a length of the cathode bonding unit is less than a maximum length of the sub-pixel in a direction perpendicular to the first direction.

In some embodiments, the plurality of cathode bonding units are arranged to be distributed at intervals in the first direction, and each of the plurality of cathode bonding units is connected to the boundary conducting layer.

In some embodiments, the cathode bonding unit is arranged at a center of the sub-pixel, such that the sub-pixel is located at two sides of the cathode bonding unit, and is symmetrical relative to the cathode bonding unit.

In some embodiments, the pixel structure includes two cathode bonding units. The extension direction of the metal wire formed by the conduction unit of one cathode bonding unit is perpendicular to the first direction, and the extension direction of the metal wire formed by the conduction unit of the other cathode bonding unit is parallel to the first direction. The sub-pixel is located at two sides of one cathode bonding unit, and is symmetrical relative to the cathode bonding unit.

In some embodiments, a material of the conduction unit is the same as a material of the boundary conducting layer arranged at an exterior of the sub-pixel.

In some embodiments, shapes of the plurality of sub-pixels include at least one of a diamond shape, a circular shape, an elliptical shape, and a diamond-like shape.

According to the second aspect of the embodiments of the present application, a display panel is provided. The display panel includes: a substrate, a driver layer and an encapsulation layer arranged from bottom to top and a plurality of the pixel structures. Each pixel structure is located between the driver layer and the encapsulation layer.

According to the pixel structure and display panel provided in the embodiments of the present application, the pixel structure includes the plurality of sub-pixels, each of the plurality of sub-pixels includes the cathode bonding unit. The cathode bonding unit includes the isolation column, the conduction unit, and the roof structure arranged from bottom to top. The extension direction of the metal wire formed by the conduction unit is perpendicular to the first direction (i.e. the evaporation direction of the display panel). The isolation column is located above the anode of the sub-pixel, the luminescent layer of the sub-pixel covers the anode and the isolation column, and the cathode of the sub-pixel covers the luminescent layer and is bonded to the conduction unit. One pixel boundary layer is arranged between every two adjacent sub-pixels. The pixel boundary layer includes the pixel definition layer, the boundary conducting layer and the roof structure arranged from bottom to top. The conduction unit is connected with the boundary conducting layer. In the aforesaid technical solution, since the extension direction of the metal wire formed by the conduction unit is perpendicular to the evaporation direction, the extension direction of the roof structure arranged above the conduction unit is perpendicular to the evaporation direction, too. That is, the roof structure in the cathode bonding unit has the minimum occlusion to the conduction unit under the roof structure in the evaporation direction. Thus, when the cathode layer is evaporated, under the same evaporation angle (the evaporation angle cannot be too large due to limitation of the process), compared with the boundary conducting layer in the pixel boundary layer between the two adjacent sub-pixels, the conduction unit of the cathode bonding unit of each sub-pixel is prone to be bonded with the cathode of the sub-pixel. Moreover, due to the connection between the conduction unit of the cathode bonding unit and the boundary conducting layer, which means that, the cathode of each sub-pixel is prone to connect to the boundary conducting layer through the conduction unit of the cathode bonding unit, as compared to the direct connection between the cathode of each sub-pixel and the boundary conducting layer. Thus, the bonding effect between the cathode of each sub-pixel and the boundary conducting layer and the yield of the display panel can be improved according to the technical solution of the present application.

DETAILED DESCRIPTION OF EMBODIMENTS

The embodiments of the present application are described with reference to the accompanying drawings in the embodiments of the present application. The terms used in the embodiments of the present application are only intended to explain the specific embodiments of the present application, rather than limiting the present application. Some specific embodiments described below can be combined with each other, and the same or similar concepts or processes may not be repeatedly described in some embodiments.

The luminescent device in the embodiments of the present application can be any one of organic light emitting diode (OLED), inorganic light emitting diode, quantum dot light emitting diode (QLED), and mini light emitting diode (Mini LED). This embodiment is described below by taking the luminescent device as the OLED as an example.

Currently, three methods for mass production of luminescent devices in a display panel are usually provided. The first method is using fine metal masks as masks, and depositing three color pixels through a evaporation processes. The second method is using an inkjet printing technology to accurately print pixels at different positions. The third method is using the evaporation process to perform whole surface film formation on a substrate, and then using the photolithography process to etch the substrate after the whole surface film formation process to separate the three color pixels. With the increase of the size of the display panel, excessive sagging of the metal mask plate is caused when the first method is applied. Thus, the third method of using the evaporation process to perform the whole surface film formation on the substrate and then using the photolithography technology to etch the substrate after the whole surface film formation has become a topic to be researched in depth in the industry.

Figure 1:
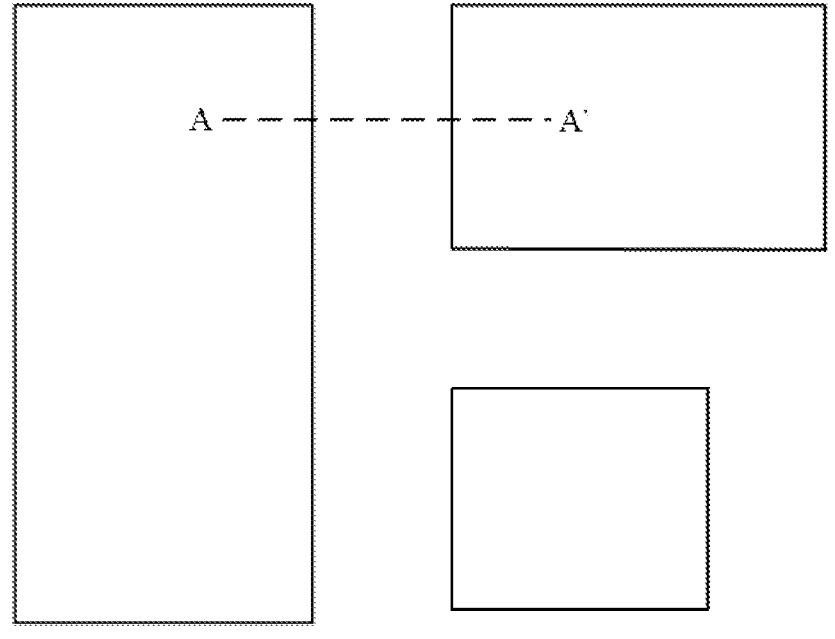
FIG. 1 illustrates a schematic diagram of any pixel structure in a display panel of the exemplary technology.

FIG. 1 illustrates a schematic diagram of any pixel structure in a display panel of an exemplary technology. As shown in FIG. 1, the pixel structure includes three sub-pixels which can be a red sub-pixel, a blue sub-pixel, and a green sub-pixel, respectively.

Figure 2:
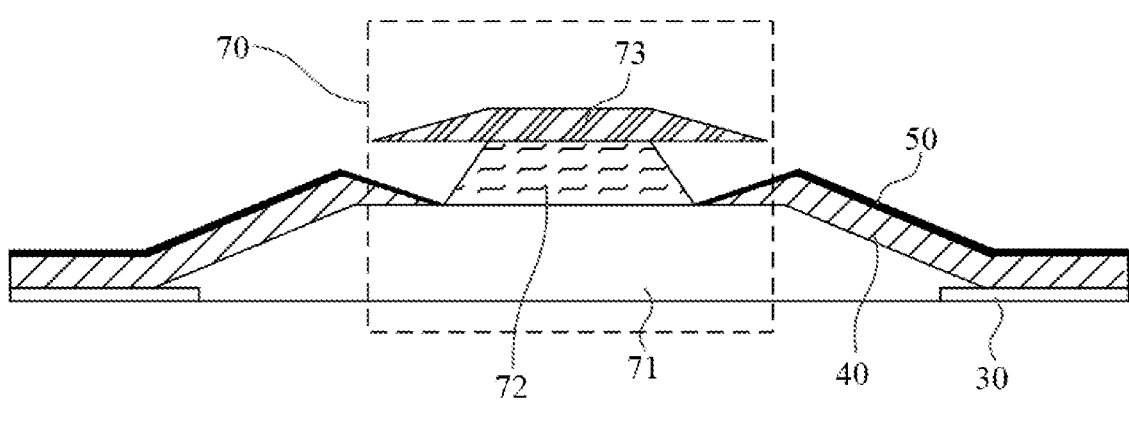
FIG. 2 illustrates a cross-sectional view of the display panel along a A-A line in FIG. 1.

FIG. 2 illustrates a cross-sectional view of the display panel along a A-A' direction in FIG. 1. As shown in FIG. 2, one pixel boundary layer 70 can be arranged between two adjacent sub-pixels. The pixel boundary layer 70 can include a pixel definition layer 71, a boundary conducting layer 72, and a second roof structure 73 arranged from bottom to top.

A luminescent layer 40 of the display panel is covered on an anode layer 30, a cathode layer 50 is covered on the luminescent layer 40, and the cathode layer 50 is bonded to the boundary conducting layer 72.

Figure 3:
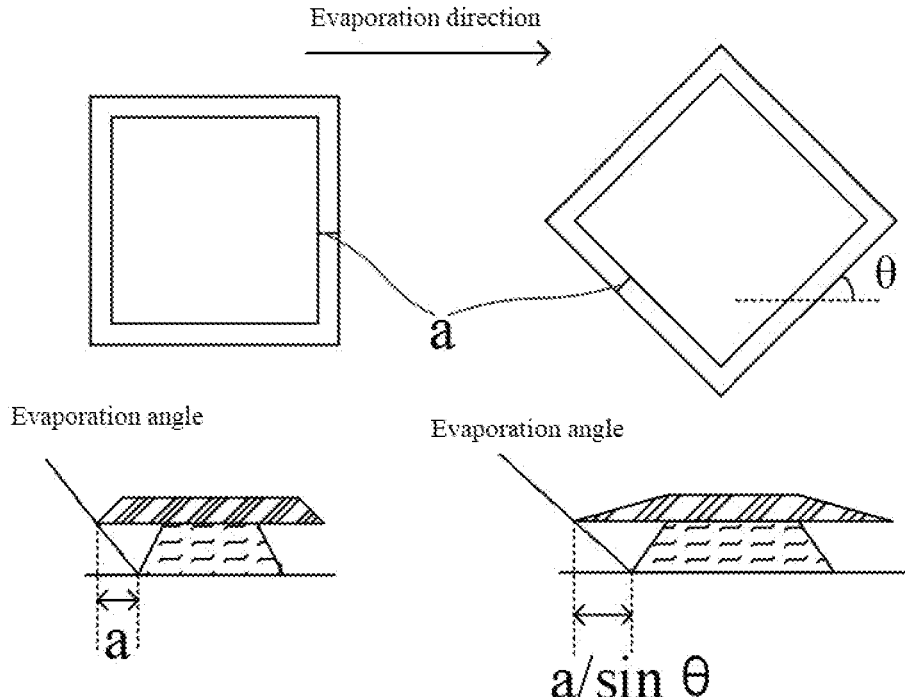
FIG. 3 illustrates a schematic diagram of evaporation angles of a rectangular sub-pixel and a diamond sub-pixel under the same process.

FIG. 3 illustrates a schematic diagram of evaporation angles of a rectangular sub-pixel and a diamond sub-pixel under the same process. As shown in FIG. 3, under the same process condition, a vertical distance between an edge of a second roof structure 73 of each of the rectangular sub-pixel and the diamond sub-pixel and an edge of the boundary conducting layer 72 is a.

In an evaporation direction, the distance between the edge of the second roof structure 73 of the rectangular sub-pixel and the edge of the boundary conducting layer 72 remains a. However, the distance between the edge of the second roof structure 73 of the diamond sub-pixel and the edge of the boundary conducting layer 72 becomes a/sin θ. Where θ represents an included angle between any edge of the diamond sub-pixel and the evaporation direction. That is, under the same process condition, the second roof structure 73 of the diamond sub-pixel covers more parts of the boundary conducting layer 72 in the evaporation direction as compared to the rectangular sub-pixel, which means that the diamond sub-pixel needs to have a larger evaporation angle than the rectangular sub-pixel, in order to achieve bonding between the cathode layer 50 and the boundary conducting layer 72.

Due to the limitation of process, the evaporation angle is usually not too large. That is, under the premise of the same process and the same evaporation angle, the effect of bonding between the cathode of the diamond sub-pixel and the boundary conducting layer 72 is worse as compared to the rectangular sub-pixel, and a phenomenon of inability to bond the cathode of the diamond sub-pixel to the boundary conducting layer 72 may even occur.

It can be understood that, under the premise of the same process and the same evaporation angle, as compared to the rectangular sub-pixel, the circular sub-pixel, the elliptical sub-pixel, the diamond-like sub-pixel, or other polygonal sub-pixel, excepting diamond shaped sub-pixels, have the poor effect of bonding between the cathode and the boundary conducting layer 72, and the phenomenon of inability to bond the cathode of the diamond sub-pixel to the boundary conducting layer 72 even occurs.

In view of this, a pixel structure is provided in the embodiments of the present application, which aims to enhance the effect of bonding between the cathode of the sub-pixel and the boundary conducting layer 72, and improve the yield of the product.

Figures 4, 5:
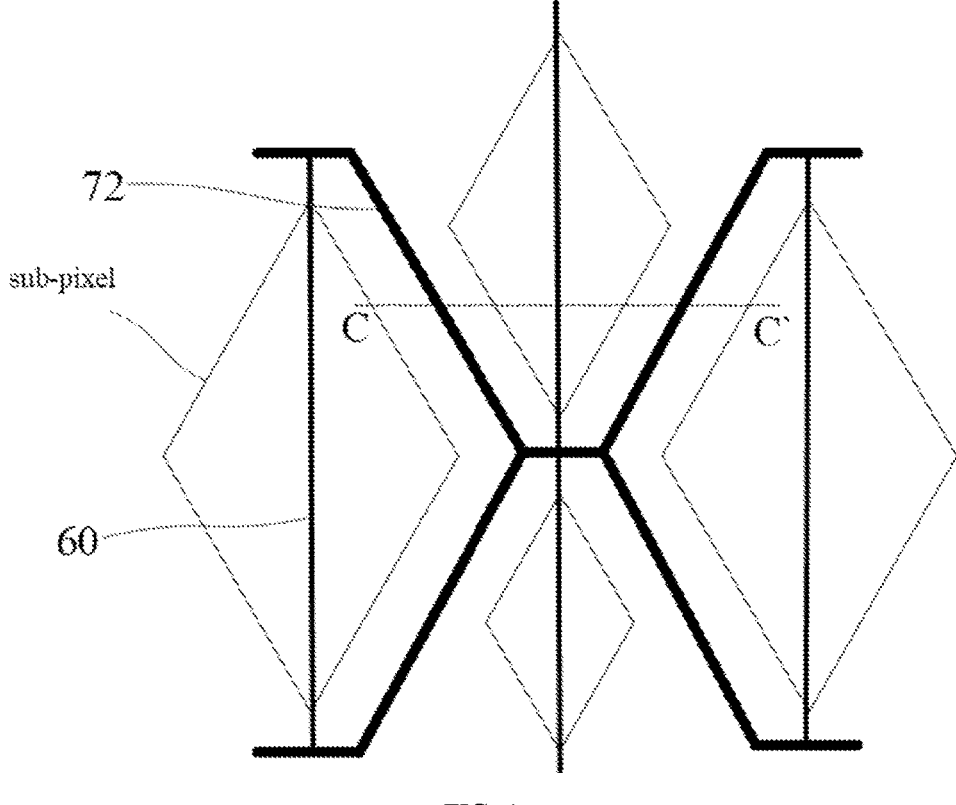
FIG. 4 illustrates a top view of a pixel structure provided in one embodiment of the present application.
FIG. 5 illustrates a cross-sectional view of the display panel along a C-C line in FIG. 4.

FIG. 4 illustrates a top view of the pixel structure provided in one embodiment of the present application. FIG. 5 illustrates a cross-sectional view of the display panel along the C-C' direction in FIG. 4. As shown in FIGS. 4 and 5, the display panel provided in the present embodiment can include a base substrate 10, a driver layer 20, a pixel structure, and an encapsulation layer 80 arranged from bottom to top.

The base substrate 10 can be a rigid substrate or a flexible substrate. A material of the rigid substrate can be glass, and a material of the flexible substrate can be a polymer material such as polyimide.

The driver layer 20 is located above the substrate 10 and can include a plurality of thin film transistors (TFTs) used to drive a luminescent layer 40 to emit light.

The pixel structure can include an anode layer 30, the luminescent layer 40, and a cathode layer 50 sequentially arranged at the top of the driver layer 20.

The anode layer 30 can include a plurality of anode units, and the luminescent layer 40 corresponding to each of the plurality of anode units can emit different colors of light.

Each anode unit corresponds to one sub-pixel. For example, if the luminescent layer 40 located above the anode unit emits red light, it means that the anode unit corresponds to a red sub-pixel. If the luminescent layer 40 located above the anode unit emits green light, it means that the anode unit corresponds to a green sub-pixel. If the luminescent layer 40 located above the anode unit emits blue light, it means that the anode unit corresponds to a blue sub-pixel.

Each sub-pixel includes at least one cathode bonding unit 60. The cathode bonding unit 60 can include an isolation column 61, a conduction unit 62, and a first roof structure 63 arranged from bottom to top. An extension direction of the metal wire formed by the conduction unit 62 is perpendicular to the first direction. The first direction is the evaporation direction of the display panel.

The isolation column 61 is located above the anode unit corresponding to the sub-pixel. The luminescent layer 40 of the sub-pixel covers the anode unit and the isolation column 61, while the cathode of the sub-pixel covers the luminescent layer 40 and is bonded to the conduction unit 62.

One pixel boundary layer 70 is arranged between two adjacent sub-pixels. The pixel boundary layer 70 includes a pixel definition layer 71, a boundary conducting layer 72 and a second roof structure 73 arranged from bottom to top. The conduction unit 62 is connected with the boundary conducting layer 72.

Since the extension direction of the metal wire formed by the conduction unit 62 is perpendicular to the evaporation direction, the extension direction of the first roof structure 63 arranged above the conduction unit 62 is perpendicular to the evaporation direction, too. That is, the first roof structure 63 in the cathode bonding unit 60 has the minimum occlusion to the conduction unit 62 under the first roof structure 63 in the evaporation direction. Thus, when the cathode layer 50 is evaporated, under the same evaporation angle, compared with the boundary conducting layer 72 in the pixel boundary layer 70 between the two adjacent sub-pixels, the conduction unit 62 of the cathode bonding unit 60 of each sub-pixel is prone to be bonded with the cathode of the sub-pixel. Moreover, due to the connection between the conduction unit 62 of the cathode bonding unit 60 and the boundary conducting layer 72, which means that, the cathode of each sub-pixel is prone to connect to the boundary conducting layer 72 through the conduction unit 62 of the cathode bonding unit 60, as compared to the direct connection between the cathode of each sub-pixel and the boundary conducting layer 72. Thus, the bonding effect between the cathode of each sub-pixel and the boundary conducting layer and the yield of the display panel can be improved according to the technical solution of the present application.

The material of the conduction unit 62 can be the same as the material of the boundary conducting layer 72 arranged at the exterior of the sub-pixel. In this way, during preparation of the pixel structure, an etching process can be performed on the same metal layer to form the corresponding conduction unit 62 and the boundary conducting layer 72, cost conservation is realized.

The material of the isolation column 61 can be the same as that of the pixel definition layer 71. For example, the material of the isolation column 61 can be an organic polyimide, and can also be an inorganic SiNx, SiOx, or SiOxNx, or the like.

The encapsulation layer 80 covers the cathode layer 50, the boundary conducting layer 72, the conduction unit 62, and the first roof structure 63.

In a direction perpendicular to the first direction, one end of the metal wire formed by the conduction unit 62 can protrude a certain length from the edge of the sub-pixel to facilitate connecting with the boundary conducting layer 72 arranged at the exterior of the sub-pixel.

As shown in FIG. 4, the cathode bonding unit 60 can be located at the center of one sub-pixel, in order that the sub-pixel is located in two areas on two sides of the cathode bonding unit 60, and is symmetrical relative to the cathode bonding unit 60. That is, the sub-pixel is further divided into two identical sub-pixels by the cathode bonding unit 60. Due to this arrangement, luminous areas of all pixels are the same, which facilitates improving the display effect.

In order to ensure the connectivity between the conduction unit 62 and the boundary conducting layer 72, two ends of the metal wire formed by the conduction unit 62 can be connected to the boundary conducting layer 72.

Figures 6, 7:
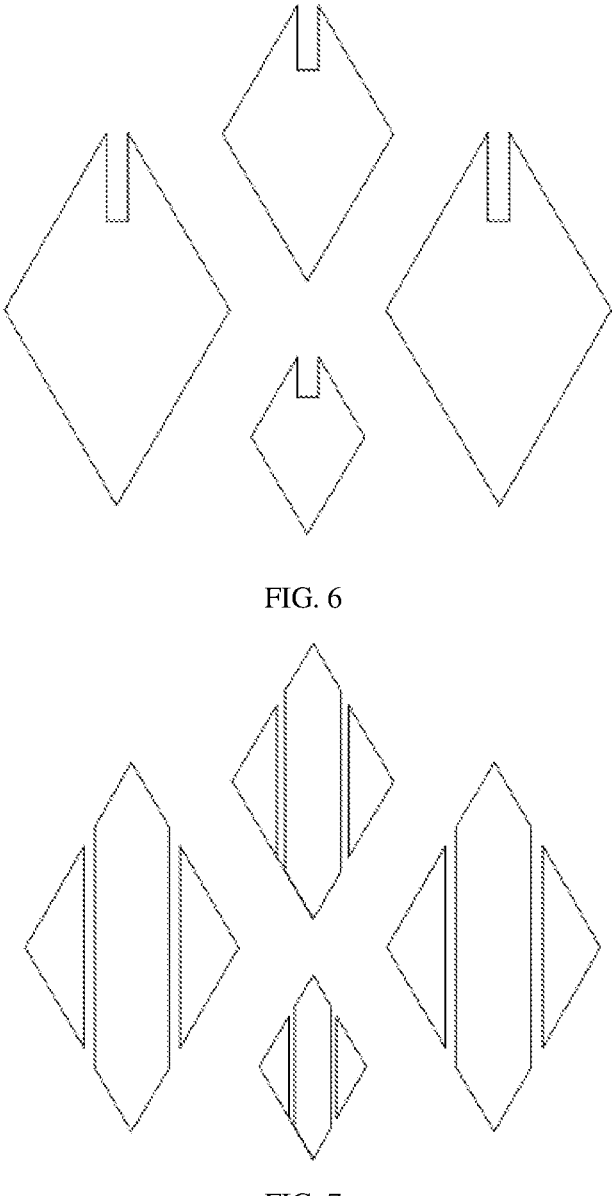
FIG. 6 illustrates a top view of the pixel structure provided in another embodiment of the present application.
FIG. 7 illustrates a top view of the pixel structure provided in yet another embodiment of the present application.

Considering that the cathode bonding unit 60 will occupy a certain display area of the sub-pixel, only one end of the metal wire formed by the conduction unit 62 can be connected to the boundary conducting layer 72. FIG. 6 illustrates a top view of the pixel structure provided in another embodiment of the present application. As shown in FIG. 6, the metal wire formed by the conduction unit 62 has a shorter length which is smaller than the maximum length of the sub-pixel perpendicular to the first direction. Due to this arrangement, the influence on the display effect can be reduced.

FIG. 7 illustrates a top view of the pixel structure provided in yet another embodiment of the present application. As shown in FIG. 7, each sub-pixel can include two cathode bonding unit 60, and the two cathode bonding units 60 are arranged at intervals in the first direction. Each cathode bonding unit 60 is connected to the boundary conducting layer 72, in order to ensure the connectivity between the conduction unit 62 of each sub-pixel and the boundary conducting layer 72.

The two cathode bonding units 60 can be symmetrical with respect to the centerline of the sub-pixels in a vertical direction of the first direction, such that the corresponding luminous areas of the sub-pixels divided by the cathode bonding units 60 are relatively more uniform, the display effect is improved accordingly.

It can be understood that each sub-pixel can also include more cathode bonding units 60 arranged at intervals in the first direction. The number of the cathode bonding units 60 is not specifically limited in the present application.

Figures 8, 9:
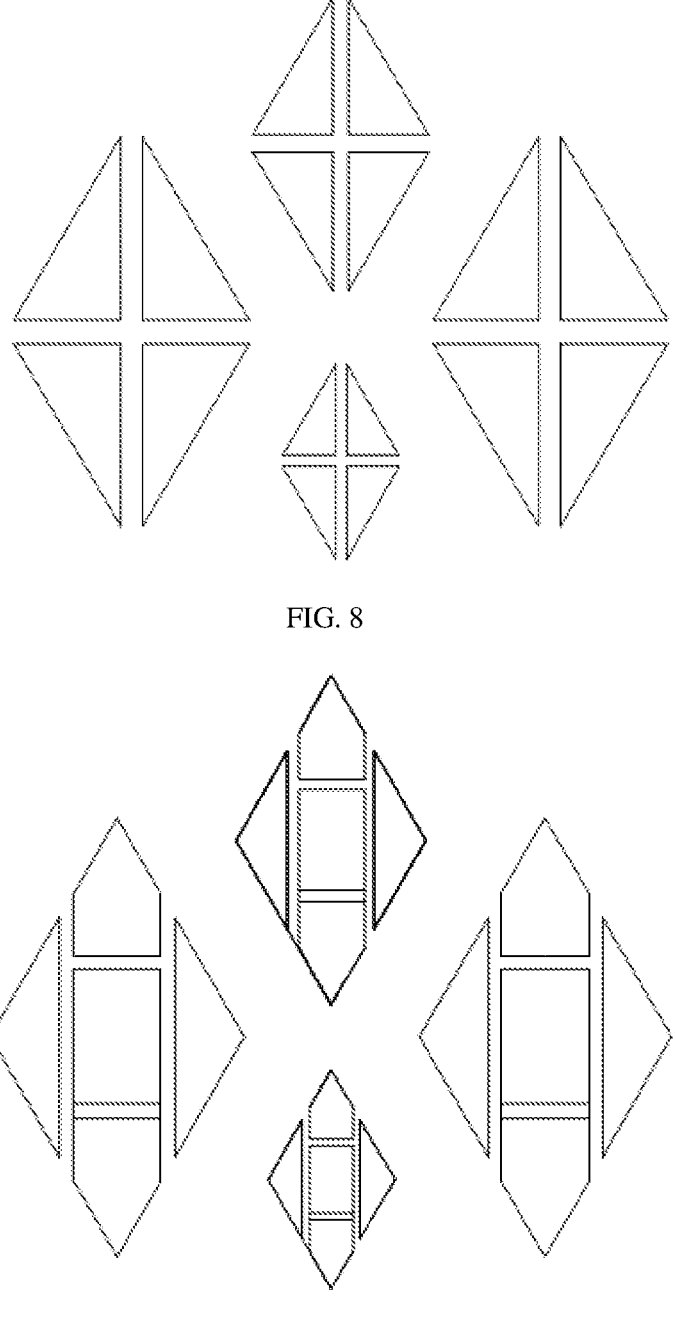
FIG. 8 illustrates a top view of the pixel structure provided in yet another embodiment of the present application.
FIG. 9 illustrates a top view of the pixel structure provided in yet another embodiment of the present application.

FIG. 8 is a top view of the pixel structure provided in another embodiment of the present application. During the preparation process of the display panel, the arrangements of different products may vary. In order to ensure that products having different arrangements can achieve a good bonding between the cathode of each sub-pixel and the boundary conducting layer 72, as shown in FIG. 8, each sub-pixel of the pixel structure includes two cross-shaped cathode bonding units 60, the extension direction of the metal wire formed by the conduction unit 62 of one cathode bonding unit 60 is perpendicular to the first direction, while the extension direction of the metal wire formed by the conduction unit 62 of the other cathode bonding unit 60 is parallel to the first direction. The sub-pixels are located on the two sides of each cathode bonding unit 60 and are symmetrical relative to the cathode bonding unit 60. Due to this arrangement, no matter how the display panel is arranged, it can be ensured that the conduction unit 62 of the cathode bonding unit 60 in one direction can be bonded to the cathode of the sub-pixel.

It can be understood that each pixel in the pixel structure provided in the present application can also include a plurality of cathode bonding units 60 with intersecting transverse shafts, as shown in FIG. 9 in order to ensure that the products having different arrangements can achieve good bonding between the cathode of each sub-pixel and the boundary conducting layer 72.

Additionally, for the plurality of sub-pixels in FIGS. 8 and 9, it only needs to ensure that at least one cathode bonding unit 60 of each pixel is connected to the external boundary conducting layer 72 to ensure the bonding effect between cathode of each sub-pixel and the boundary conducting layer 72.

It can be understood that the sub-pixels in the present application can also be in a circular shape, an elliptical shape, a diamond-like shape, or other polygonal shape, excepting a diamond shape. The shapes of the sub-pixels are not particularly limited in the present application.

According to the pixel structure and display panel provided in the embodiments of the present application, the pixel structure includes the plurality of sub-pixels, each of the plurality of sub-pixels includes one or multiple cathode bonding unit(s) 60. Each cathode bonding unit 60 includes the isolation column 61, the conduction unit 62, and the first roof structure 63 arranged from bottom to top. The extension direction of the metal wire formed by the conduction unit 62 is perpendicular to the first direction (i.e. the evaporation direction of the display panel). The isolation column 61 is located above the anode of the sub-pixel, the luminescent layer of the sub-pixel covers the anode and the isolation column 61, and the cathode of the sub-pixel covers the luminescent layer and is bonded to the conduction unit 62. One pixel boundary layer 70 is arranged between every two adjacent sub-pixels. The pixel boundary layer 70 includes the pixel definition layer 71, the boundary conducting layer 72 and the second roof structure 73 arranged from bottom to top. The conduction unit 62 is connected with the boundary conducting layer 72. In the aforesaid technical solution, since the extension direction of the metal wire formed by the conduction unit 62 is perpendicular to the evaporation direction, the extension direction of the first roof structure 63 arranged above the conduction unit 62 is perpendicular to the evaporation direction, too. That is, the first roof structure 63 in the cathode bonding unit 60 has the minimum occlusion to the conduction unit 62 under the first roof structure

63 in the evaporation direction. Thus, when the cathode layer 50 is evaporated, under the same evaporation angle (the evaporation angle cannot be too large due to limitation of the process), compared with the boundary conducting layer 72 in the pixel boundary layer 70 between the two adjacent sub-pixels, the conduction unit 62 of the cathode bonding unit 60 of each sub-pixel is prone to be bonded with the cathode of the sub-pixel. Moreover, due to the connection between the conduction unit 62 of the cathode bonding unit 60 and the boundary conducting layer 72, which means that, the cathode of each sub-pixel is prone to connect to the boundary conducting layer 72 through the conduction unit 62 of the cathode bonding unit 60, as compared to the direct connection between the cathode of each sub-pixel and the boundary conducting layer 72. Thus, the bonding effect between the cathode of each sub-pixel and the boundary conducting layer 72 and the yield of the display panel can be improved according to the technical solution of the present application.

In the embodiments of the present application, the descriptions of the embodiments in the present application are emphasized respectively. Regarding the parts that are not described in detail in some embodiments, reference may be made to the relevant descriptions in other embodiments.

In addition, the proportional relationship of sizes of the various components in the accompanying drawings is only schematic and does not reflect the actual proportional relationship of sizes of the various components.

In the description of the present application, it needs to be understood that, directions or location relationships represented by terms such as "center", "longitudinal", "transverse", "up", "down", "front", "rear", "left", "right", "vertical", "horizontal", "top", "bottom", "inside", "outside", etc., are the directions or location relationships shown in the accompanying figures, and are only intended to describe the present application conveniently and are for the purpose of conciseness of the description, but should not be interpreted as indicating or implying that a device or a component indicated by the terms must have specific locations and be constructed and manipulated according to the specific locations. Therefore, these terms shouldn't be considered as limitation to the present application.

In the descriptions of the present application, it needs to be noted that, terms such as "mount", "connect with each other", "connect", "fix", etc., should be generalizedly interpreted, unless additional explicit stipulation and limitation are provided. For example, "connect" may be interpreted as being fixedly connected, detachably connected, or connected integrally; "connect" can also be interpreted as being mechanically connected or electrically connected; "connect" may be further interpreted as being directly connected or indirectly connected through intermediary, or being internal communication between two components or an interaction relationship between the two components. The person of ordinary skill in the art may interpret the specific meanings of the aforementioned terms in the present application according to specific conditions.

It should be understood that, when a term "comprise/include" is used in the description and annexed claims, the term "comprise/include" indicates existence of the described characteristics, integer, steps, operations, elements and/or components, but not exclude existence or adding of one or more other characteristics, integer, steps, operations, elements, components and/or combination thereof.

In the descriptions of the present application, "/" meaning that the associated objects have the association relationship of "or", unless otherwise "/" is additionally defined. For example, A/B may represent A or B. The phrase of "and/or" in the present application is merely an association relationship for describing associated objects, and indicates existence of three relationships. For example, A and/or B may represent that A exists alone, A and B exist at the same time, and B exists alone. A and B may be singular or plural.

In the present application, "a plurality of" refers to two or more than two, unless otherwise "a plurality of" is additionally defined. "At least one of the following items" or similar expression refers to any combination of these items, including any combination of a single item or multiple items. For example, "at least one of a, b or c" can represent a, b, c, a-b, a-c, b-c, or a-b-c. Where, a, b, and c may be singular or plural.

In addition, in the descriptions of the specification and the annexed claims of the present application, terms such as "first", "second", "third", etc., are used to distinguish similar objects, without necessarily describing a specific order or sequence of order. It should be understood that the data used in this manner can be interchanged in appropriate condition, in order that the embodiments described herein can be implemented in an order other than the contents illustrated or described herein.

The descriptions of "referring to one embodiment" or "referring to some embodiments", or the like as described in the specification of the present application means that a specific feature, structure, or characters which are described with reference to this embodiment are included in one embodiment or some embodiments of the present application. Thus, the sentences of "in one embodiment", "in some embodiments", "in some other embodiments", "in other embodiments", and the like in this specification are not necessarily referring to the same embodiment, but instead indicate "one or more embodiments instead of all embodiments", unless otherwise they are specially emphasize in other manner.

In conclusion, it should be noted that, the aforesaid various embodiments are merely used to explain the technical solutions of the present application, and are not intended to limit the technical solutions of the present application. Although the present application has been described in detail with reference to the embodiments described above, a person of ordinary skill in the art should understand that the technical solutions described in these embodiments can still be modified, or some or all technical features in the embodiments can be equivalently replaced. However, these modifications or replacements do not make the essences of corresponding technical solutions to deviate from the spirit and the scope of the technical solutions of the embodiments of the present application.

What is claimed is:

1. A pixel structure: comprising a plurality of sub-pixels, and each sub-pixel comprises a plurality of cathode bonding units;

each cathode bonding unit comprises an isolation column, a conduction unit, and a first roof structure arranged from bottom to top, an extension direction of a metal wire formed by the conduction unit is perpendicular to a first direction, and the first direction is an evaporation direction of a display panel;

the isolation column is located at a top of an anode of the sub-pixel, a luminescent layer of the sub-pixel covers the anode and the isolation column, and a cathode of the sub-pixel covers the luminescent layer and is bonded to the conduction unit; and one pixel boundary layer is arranged between two adjacent sub-pixels, wherein the pixel boundary layer comprises a pixel definition layer, a boundary conducting layer and a second roof structure arranged from bottom to top, and the conduction unit is connected to the boundary conducting layer.

2. The pixel structure according to claim 1, wherein one end of the metal wire formed by the conduction unit protrudes a target length from an edge of the sub-pixel in a direction perpendicular to the first direction.

3. The pixel structure according to claim 1, wherein one end of the metal wire formed by the conduction unit is connected to the boundary conducting layer.

4. The pixel structure according to claim 3, wherein a length of the cathode bonding unit is less than a maximum length of the sub-pixel in a direction perpendicular to the first direction.

5. The pixel structure according to claim 1, wherein the plurality of cathode bonding units are arranged to be distributed at intervals in the first direction, and each of the plurality of cathode bonding units is connected to the boundary conducting layer.

6. The pixel structure according to claim 1, wherein the cathode bonding unit is arranged at a center of the sub-pixel, such that the sub-pixel is located at two sides of the cathode bonding unit, and is symmetrical relative to the cathode bonding unit.

7. The pixel structure according to claim 6, wherein the pixel structure comprises two cathode bonding units, wherein the extension direction of the metal wire formed by the conduction unit of one cathode bonding unit is perpendicular to the first direction, and the extension direction of the metal wire formed by the conduction unit of the other cathode bonding unit is parallel to the first direction; the sub-pixel is located at two sides of one cathode bonding unit, and is symmetrical relative to the cathode bonding unit.

8. The pixel structure according to claim 1, wherein a material of the conduction unit is the same as a material of the boundary conducting layer arranged at an exterior of the sub-pixel.

9. The pixel structure according to claim 1, wherein shapes of the plurality of sub-pixels include at least one of a diamond shape, a circular shape, an elliptical shape, and a diamond-like shape.

10. A display panel, comprising: a substrate, a driver layer, and an encapsulation layer arranged from bottom to top and a plurality of pixel structures;

wherein each pixel structure comprises a plurality of sub-pixels, and each sub-pixel comprises a plurality of cathode bonding units;

each cathode bonding unit comprises an isolation column, a conduction unit, and a first roof structure arranged from bottom to top, an extension direction of a metal wire formed by the conduction unit is perpendicular to a first direction, and the first direction is an evaporation direction of a display panel;

the isolation column is located at a top of an anode of the sub-pixel, a luminescent layer of the sub-pixel covers the anode and the isolation column, and a cathode of the sub-pixel covers the luminescent layer and is bonded to the conduction unit; and one pixel boundary layer is arranged between two adjacent sub-pixels, wherein the pixel boundary layer comprises a pixel definition layer, a boundary conducting layer and a second roof structure arranged from bottom to top, and the conduction unit is connected to the boundary conducting layer;

wherein each pixel structure is located between the driver layer and the encapsulation layer.

11. The display panel according to claim 10, wherein one end of the metal wire formed by the conduction unit protrudes a target length from an edge of the sub-pixel in a direction perpendicular to the first direction.

12. The display panel according to claim 10, wherein one end of the metal wire formed by the conduction unit is electrically connected with the boundary conducting layer.

13. The display panel according to claim 12, wherein a length of the cathode bonding unit is less than a maximum length of the sub-pixel in a direction perpendicular to the first direction.

14. The display panel according to claim 10, wherein the plurality of cathode bonding units are arranged to be distributed at intervals in the first direction, and each of the plurality of cathode bonding units is connected to the boundary conducting layer.

15. The display panel according to claim 10, wherein the cathode bonding unit is arranged at a center of the sub-pixel, such that the sub-pixel is located at two sides of the cathode bonding unit, and is symmetrical relative to the cathode bonding unit.

16. The display panel according to claim 15, wherein the pixel structure comprises two cathode bonding units, wherein the extension direction of the metal wire formed by the conduction unit of one cathode bonding unit is perpendicular to the first direction, and the extension direction of the metal wire formed by the conduction unit of the other cathode bonding unit is parallel to the first direction; the sub-pixel is located at two sides of one cathode bonding unit, and is symmetrical relative to the cathode bonding unit.

17. The display panel according to claim 10, wherein a material of the conduction unit is the same as a material of the boundary conducting layer arranged at an exterior of the sub-pixel.

18. The display panel according to claim 10, wherein shapes of the plurality of sub-pixels include at least one of a diamond shape, a circular shape, an elliptical shape, and a diamond-like shape.

\* \* \* \* \*